United States Patent
Odahara

(10) Patent No.: US 10,998,373 B2
(45) Date of Patent: May 4, 2021

(54) IMAGING ELEMENT AND IMAGING DEVICE

(71) Applicant: SONY SEMICONDUCTOR SOLUTIONS CORPORATION, Kanagawa (JP)

(72) Inventor: Masaki Odahara, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/314,937

(22) PCT Filed: Jun. 6, 2017

(86) PCT No.: PCT/JP2017/020904
§ 371 (c)(1),
(2) Date: Jan. 3, 2019

(87) PCT Pub. No.: WO2018/012143
PCT Pub. Date: Jan. 18, 2018

(65) Prior Publication Data
US 2019/0312079 A1    Oct. 10, 2019

(30) Foreign Application Priority Data

Jul. 11, 2016 (JP) .............................. JP2016-136937

(51) Int. Cl.
*H01L 27/148* (2006.01)
*H01L 27/146* (2006.01)
(Continued)

(52) U.S. Cl.
CPC .. *H01L 27/14812* (2013.01); *H01L 27/14603* (2013.01); *H01L 27/14634* (2013.01);
(Continued)

(58) Field of Classification Search
CPC ..... H04N 5/3745–37455; H04N 5/378; H04N 5/3355; H03M 1/00–645; H01L 27/14643–14663; H01L 27/1464
(Continued)

(56) References Cited

U.S. PATENT DOCUMENTS

2006/0023109 A1    2/2006 Mabuchi et al.
2007/0080418 A1*   4/2007 Ryu .................. H01L 27/14618
                                                    257/459
(Continued)

FOREIGN PATENT DOCUMENTS

JP    2006-049361    2/2006
JP    2011-159958    8/2011
(Continued)

OTHER PUBLICATIONS

International Search Report prepared by the Japan Patent Office dated Aug. 1, 2017, for International Application No. PCT/JP2017/020904.

*Primary Examiner* — Xi Wang
(74) *Attorney, Agent, or Firm* — Sheridan Ross P.C.

(57) ABSTRACT

To simplify the interconnection of signal lines in an imaging element including two semiconductor chips. An imaging element includes a pixel chip and a circuit chip. The pixel chip includes a plurality of pixels each including a charge transfer section configured to transfer a charge generated in accordance with incident light to a charge retention section in accordance with a control signal, and a plurality of first control signal transmission sections each configured to transmit the control signal for each of the charge transfer sections. The circuit chip includes a control signal generation section configured to generate the control signal for each of the charge transfer sections of the plurality of pixels, and a plurality of second control signal transmission sections (Continued)

provided to individually correspond to the first control signal transmission sections and each configured to transmit the generated control signal.

18 Claims, 12 Drawing Sheets

(51) Int. Cl.
  *H04N 5/369*    (2011.01)
  *H04N 5/378*    (2011.01)
  *H04N 5/374*    (2011.01)
  *H04N 5/372*    (2011.01)

(52) U.S. Cl.
  CPC ....... *H01L 27/14636* (2013.01); *H04N 5/372* (2013.01); *H04N 5/379* (2018.08); *H04N 5/374* (2013.01); *H04N 5/378* (2013.01)

(58) Field of Classification Search
  USPC ........................ 348/294, 300, 308, 572, 573; 341/155–172
  See application file for complete search history.

(56) References Cited

U.S. PATENT DOCUMENTS

| | | | |
|---|---|---|---|
| 2012/0057056 A1* | 3/2012 | Oike | ................ H01L 27/14634 348/294 |
| 2013/0277534 A1 | 10/2013 | Watanabe | |
| 2013/0285180 A1 | 10/2013 | Wang et al. | |
| 2014/0070411 A1* | 3/2014 | Okada | ..................... H01L 21/50 257/737 |
| 2014/0077063 A1* | 3/2014 | Cho | ................ H01L 27/14634 250/208.1 |
| 2014/0139713 A1* | 5/2014 | Gomi | ................ H01L 27/14618 348/308 |
| 2014/0334601 A1* | 11/2014 | Shizukuishi | ......... A61B 5/0035 378/62 |
| 2016/0211299 A1 | 7/2016 | Arita | |

FOREIGN PATENT DOCUMENTS

| | | |
|---|---|---|
| JP | 2013-225632 | 10/2013 |
| JP | 2013-232647 | 11/2013 |
| JP | 2015-070591 | 4/2015 |

\* cited by examiner

IMAGING ELEMENT AND IMAGING DEVICE

CROSS REFERENCE TO RELATED APPLICATIONS

This application is a national stage application under 35 U.S.C. 371 and claims the benefit of PCT Application No. PCT/JP2017/020904 having an international filing date of 6 Jun. 2017, which designated the United States, which PCT application claimed the benefit of Japanese Patent Application No. 2016-136937 filed 11 Jul. 2016, the entire disclosures of each of which are incorporated herein by reference.

TECHNICAL FIELD

The present technology relates to an imaging element and an imaging device. Specifically, the present technology relates to an imaging element and an imaging device including a plurality of semiconductor chips.

BACKGROUND ART

Thus far, an imaging element that includes a chip in which pixels are formed and a chip in which a circuit that processes image signals from the pixels is formed has been used. The pixel includes an analog circuit, and uses a transistor with a relatively high breakdown voltage. On the other hand, the circuit that processes image signals includes mainly a digital circuit, and uses a transistor with a relatively low breakdown voltage. By arranging these on different chips, the chips can be manufactured by selecting processes suitable for the respective circuits, and the imaging element can be made to achieve high performance and low cost. For example, a solid-state imaging device that includes a first chip including pixels and a second chip including a circuit that processes a signal outputted from the first chip and a circuit that generates a control signal for a pixel is proposed (for example, see Patent Literature 1). In this solid-state imaging device, after the first chip and the second chip are stuck together, a via piercing the first chip is formed and these chips are electrically connected together by a metal embedded in the via, and an image signal and a control signal are transmitted. Such a via is referred to as a through silicon via (TSV).

CITATION LIST

Patent Literature

Patent Literature 1: JP 2011-159958A

DISCLOSURE OF INVENTION

Technical Problem

In the conventional technology described above, the transmission of signals between the chips is performed by the TSV. However, the TSV is a via piercing the first chip, and therefore requires a relatively large occupation area. Further, in order to lessen influence on circuit elements of pixels etc. due to a process that forms such a via, it is necessary to form the TSV in an area apart from the pixels. Hence, the TSV is formed in an end portion of the first chip. Hence, it is necessary that a signal line that transmits an image signal and a signal line that transmits a control signal be drawn up to the end portion of the first chip, and there is a problem that interconnection is complicated.

The present technology has been made in view of such circumstances, and an object of the present technology is to simplify the interconnection of signal lines etc. in an imaging element including two semiconductor chips.

Solution to Problem

The present technology has been made in order to solve the above problem. A first aspect of the present technology is an imaging element including: a pixel chip including a plurality of pixels each including a charge transfer section configured to transfer a charge generated in accordance with incident light to a charge retention section in accordance with a control signal, and a plurality of first control signal transmission sections each configured to transmit the control signal for each of the charge transfer sections; and a circuit chip including a control signal generation section configured to generate the control signal for each of the charge transfer sections of the plurality of pixels, and a plurality of second control signal transmission sections provided to individually correspond to the first control signal transmission sections and each configured to transmit the generated control signal. This provides an action in which a control signal of each of a plurality of charge transfer sections is transmitted by the first control signal transmission section and the second control signal transmission section.

In addition, in the first aspect, the plurality of first control signal transmission sections may include a plurality of first control signal pads, and the plurality of second control signal transmission sections may include a plurality of second control signal pads. This provides an action in which a control signal of each of a plurality of charge transfer sections is transmitted by the first control signal pad and the second control signal pad.

In addition, in the first aspect, the plurality of first control signal pads may be arranged in a central portion of the pixel chip. This provides an action in which a control signal is transmitted by the first control signal pad placed in a central portion of the pixel chip.

In addition, in the first aspect, the plurality of first control signal pads and the plurality of second control signal pads may be connected together by thermocompression bonding. This provides an action in which the first control signal pad and the second control signal pad are connected together by thermocompression bonding.

In addition, in the first aspect, the plurality of first control signal transmission sections and the plurality of second control signal transmission sections may contain copper. This provides an action in which the first control signal pad and the second control signal pad containing copper are used.

In addition, in the first aspect, the pixel chip may further include a first image signal transmission section configured to transmit an image signal generated in accordance with a charge transferred to the charge retention section, and the circuit chip may further include an analog/digital conversion section configured to analog/digital convert the generated image signal, and a second image signal transmission section provided to correspond to the first image signal transmission section and configured to transmit the generated image signal to the analog/digital conversion section. This provides an action in which an image signal transmitted by the first image signal transmission section and the second image signal transmission section is analog/digital converted.

In addition, in the first aspect, the first image signal transmission section may include a first image signal pad, the second image signal transmission section may include a second image signal pad, and the second image signal transmission section may include a second image signal pad. This provides an action in which an image signal is transmitted by the first image signal pad and the second image signal pad.

In addition, in the first aspect, the first image signal pad may be placed in a central portion of the pixel chip. This provides an action in which an image signal is transmitted by the first image signal pad placed in a central portion of the pixel chip.

In addition, in the first aspect, the analog/digital conversion sections may be arranged scatteredly for pixel units each including a plurality of pixels. This provides an action in which the analog/digital conversion section is placed for each pixel unit.

In addition, in the first aspect, the control signal generation section may generate, as the control signals, signals that sequentially cause the charge transfer sections of the plurality of pixels to transfer the generated charges, and the pixel chip may sequentially transfer the generated charges to the charge retention sections for the plurality of pixels. This provides an action in which transfers of charges by the charge transfer sections of a plurality of pixels are sequentially performed.

In addition, a second aspect of the present technology is an imaging device including: a pixel chip including a plurality of pixels each including a charge transfer section configured to transfer a charge generated in accordance with incident light to a charge retention section in accordance with a control signal, a plurality of first control signal transmission sections each configured to transmit the control signal for each of the charge transfer sections, and a first image signal transmission section configured to transmit an image signal generated in accordance with a charge transferred to the charge retention section; and a circuit chip including a control signal generation section configured to generate the control signal for each of the charge transfer sections of the plurality of pixels, a plurality of second control signal transmission sections provided to individually correspond to the first control signal transmission sections and each configured to transmit the generated control signal, an analog/digital conversion section configured to analog/digital convert the generated image signal, a second image signal transmission section provided to correspond to the first image signal transmission section and configured to transmit the generated image signal to the analog/digital conversion section, and a processing circuit configured to process the analog/digital converted image signal. This provides an action in which a control signal of each of a plurality of charge transfer sections is transmitted by the first control signal transmission section and the second control signal transmission section.

Advantageous Effects of Invention

According to the present technology, an excellent effect in which the interconnection of signal lines is simplified in an imaging element including two semiconductor chips can be exhibited. Note that effects described herein are not necessarily limitative, and any effect that is desired to be described in the present disclosure may be admitted.

MODE(S) FOR CARRYING OUT THE INVENTION

Hereinbelow, forms for implementing the present technology (hereinafter, referred to as embodiments) are described. The description is given in the following order.
1. Configuration of embodiment
2. Operation of embodiment
<1. Configuration of Embodiment>
[Configuration of Imaging Device]

Figure 1:
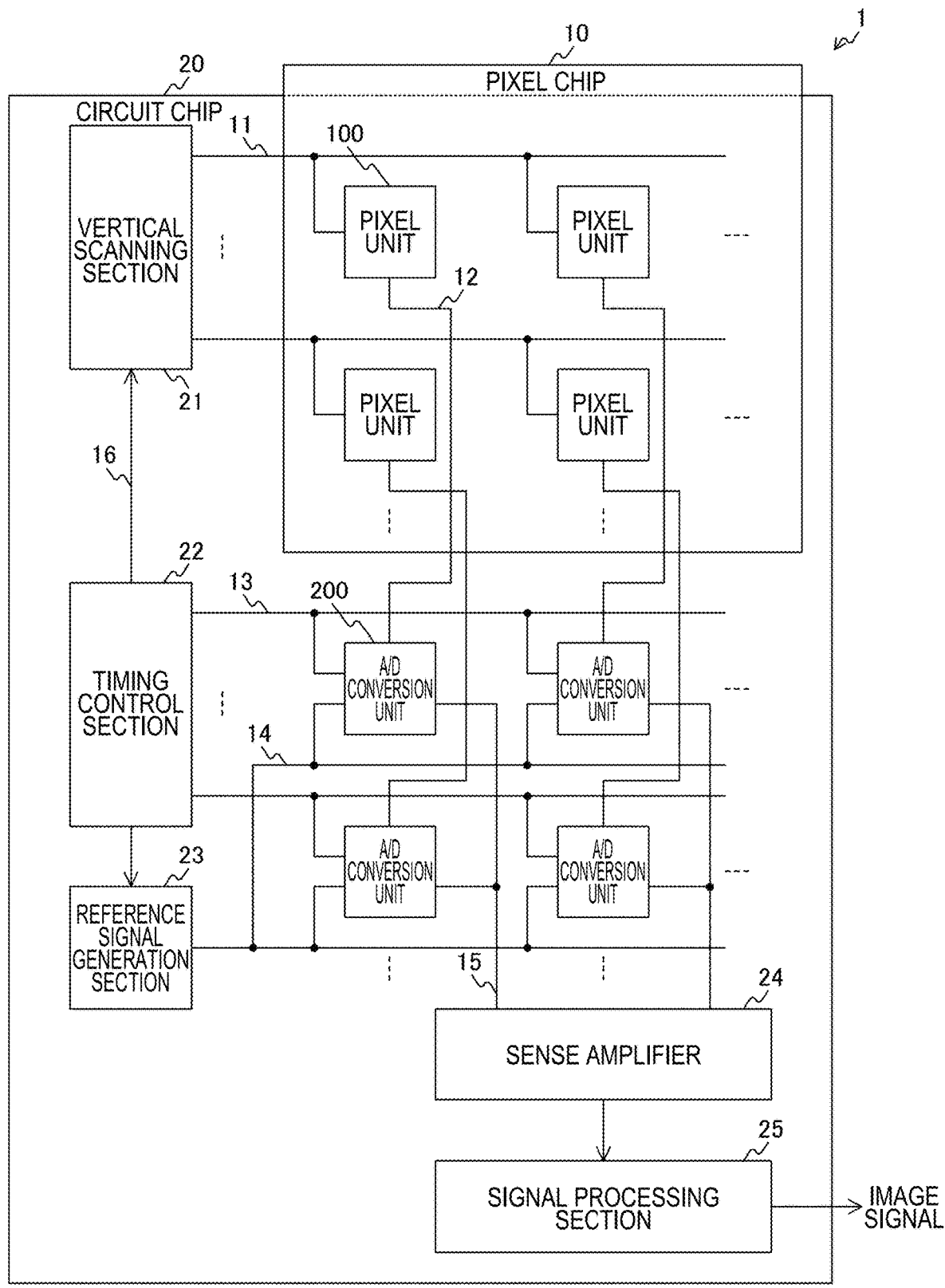
FIG. 1 is a diagram showing a configuration example of an imaging device 1 in an embodiment of the present technology.

FIG. 1 is a diagram showing a configuration example of an imaging device 1 in an embodiment of the present technology. The imaging device 1 includes a pixel chip 10 and a circuit chip 20.

The pixel chip 10 includes pixel units 100. Further, the circuit chip 20 includes analog/digital (A/D) conversion units 200, a vertical scanning section 21, a timing control section 22, a reference signal generation section 23, a sense amplifier 24, and a signal processing section 25. These two chips are joined together in the imaging device 1.

The pixel unit 100 includes a plurality of pixels each of which generates an image signal. In the pixel chip 10 of the drawing, a plurality of pixel units 100 are arranged in a two-dimensional lattice form. Control signals are inputted to the pixel unit 100 from the vertical scanning section 21 via a signal line 11. Further, image signals generated by the pixels of the pixel unit 100 are outputted via a signal line 12. Details of the configuration of the pixel unit 100 are described later.

The analog/digital conversion unit 200 analog/digital converts image signals outputted from the pixel unit 100. The analog/digital conversion unit 200 is placed for each of the pixel units 100 described above, and performs analog/digital conversion of image signals outputted by the corresponding pixel unit 100. The digital image signal after the analog/ digital conversion is outputted via a signal line 15. Details of the configuration of the analog/digital conversion unit are described later.

The vertical scanning section 21 generates control signals of the pixel unit 100. The vertical scanning section 21 generates and outputs a control signal for each row of the pixel unit 100 in the pixel chip 10. A control signal is inputted to the pixel units 100 arranged in one row of the pixel chip 10 in common. Note that the vertical scanning section 21 is an example of a control signal generation section described in the claims.

The reference signal generation section 23 generates a reference signal, and outputs the reference signal to the analog/digital conversion unit 200. The reference signal is outputted via a signal line 14. Here, the reference signal is a signal in which voltage changes in a ramp form.

The timing control section 22 controls the vertical scanning section 21, the reference signal generation section 23, and the analog/digital conversion unit 200. The timing control section 22 generates and outputs control signals that control the operating timings of these sections.

The sense amplifier 24 amplifies digital image signals outputted from the analog/digital conversion unit 200. The sense amplifier 24 sequentially reads out digital image signals from the plurality of analog/digital conversion units 200, amplifies the digital image signals, and outputs the digital image signals to the signal processing section 25.

The signal processing section 25 processes digital image signals outputted from the sense amplifier 24. As this processing, for example, black level adjustment processing and image signal rearrangement processing may be performed. Note that the signal processing section 25 falls under a processing circuit described in the claims.

[Configuration of Pixel Unit]

Figure 2:
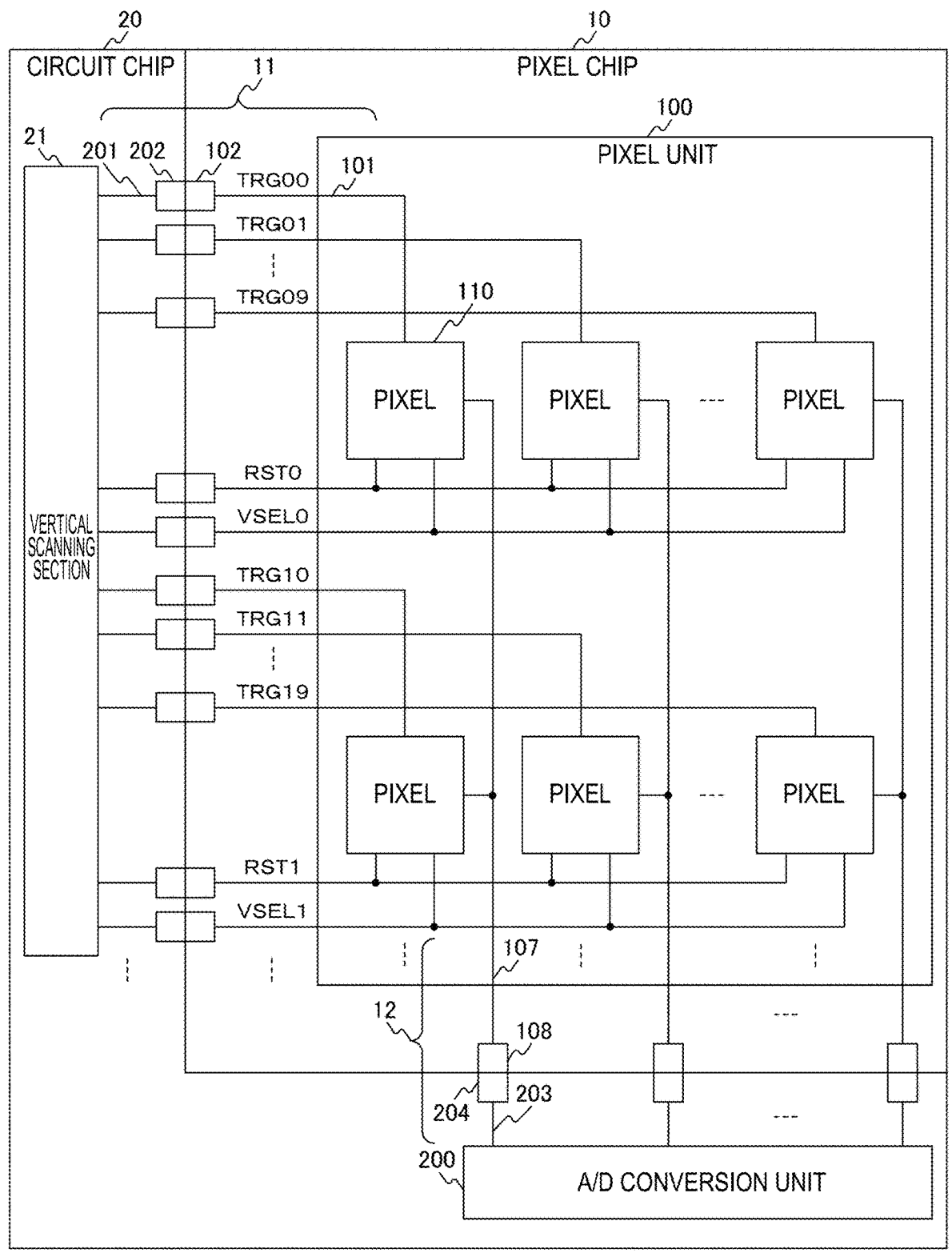
FIG. 2 is a diagram showing a configuration example of a pixel unit 100 in an embodiment of the present technology.

FIG. 2 is a diagram showing a configuration example of the pixel unit 100 in an embodiment of the present technology. The drawing shows the configuration of the pixel unit 100 and the connection of signal lines between the pixel chip 10 and the circuit chip 20.

A pixel 110 includes a photoelectric conversion element that generates an image signal, and generates an image signal in accordance with incident light. As shown in the drawing, pixels 110 are arranged in a two-dimensional lattice form. In the drawing, a pixel unit 100 in which 10×10 pixels 110 are arranged is envisaged. A control signal is inputted to the pixel 110 from the vertical scanning section 21 via the signal line 11. The signal line 11 includes a plurality of signal lines, and is drawn to the pixel 110. If a description is given using the pixel 110 placed at the upper left of the pixel unit 100 of the drawing as an example, a transfer gate signal line TRG (transfer gate) 00, a resetting signal line RST (reset) 0, and a vertical selection signal line VSEL (vertical select) 0 are drawn to the pixel 110.

The transfer gate signal line TRG00 is a signal line that transmits a control signal to a charge transfer section described later. This control signal is a control signal for causing a charge generated by a photoelectric conversion section to be transferred to a charge retention section. Further, the transfer gate signal line TRG00 is drawn uniquely to the pixel 110 placed in the pixel unit 100, and different control signals are transmitted individually to pixels 110. In the drawing, these signal lines are distinguished by being marked with row and column numbers. For example, TRG00 denotes the signal line drawn to the pixel 110 placed in the 1st row and the 1st column, and TRG19 denotes the signal line drawn to the pixel 110 placed in the 2nd row and the 10th column.

The resetting signal line RST0 is a signal line that transmits a control signal for simultaneously resetting the pixels 110 arranged in one row. The selection signal line VSEL0 is a signal line that transmits a control signal that simultaneously selects the pixels 110 arranged in one row. In the drawing, these signal lines are distinguished by being marked with row numbers. For example, RST0 and VSEL0 denote the signal lines drawn to the pixels 110 arranged in the 1st row.

As described later, the transfer gate signal line TRG00, the resetting signal line RST0, and the selection signal line VSEL0 are connected to the gates of MOS transistors. If a voltage (hereinafter, referred to as an ON signal) more than or equal to the threshold voltage between the gate and the source of a MOS transistor is inputted to the corresponding one of these signal lines, the MOS transistor enters a conduction state.

Further, an image signal generated by the pixel 110 is transmitted to the analog/digital conversion unit 200 via the signal line 12. The signal line 12 includes a plurality of signal lines, and are drawn on a column basis. That is, one of the plurality of signal lines 12 is connected to the pixels 110 arranged in one column in common.

Note that the signal lines included in the signal line 11 are arranged between the pixel chip 10 and the circuit chip 20, and transmit control signals. If this situation is described using the transfer gate signal line TRG00 as an example, the transfer gate signal line TRG00 transmits a control signal via a first control signal transmission section 102 and a second control signal transmission section 202. The first control signal transmission section 102 is placed in the pixel chip 10, and transmits the control signal of the transfer gate signal line TRG00. Further, the second control signal transmission section 202 is placed in the circuit chip 20, and transmits the control signal of the transfer gate signal line TRG00. As the first control signal transmission section 102, a first control signal pad that is a pad formed on the joint surface of the pixel chip 10 may be used. Similarly, as the second control signal transmission section 202, a second control signal pad that is a pad formed on the joint surface of the circuit chip 20 may be used.

Each of these pads contains a conductor. Further, when joining the pixel chip 10 and the circuit chip 20 together, alignment is performed so that these pads are in contact with each other. After that, thermocompression bonding is performed, and thereby the pixel chip 10 and the circuit chip 20 can be joined together. In this event, electrical connection can be obtained between these pads. Note that a pad containing copper may be used for these pads, for example.

The first control signal transmission section 102 and the pixel 110 are interconnected together by a first control signal line 101, and a control signal is transmitted between them. Further, the second control signal transmission section 202 and the vertical scanning section 21 are interconnected together by a second control signal line 201, and a control signal is transmitted between them. Thus, the transmission of a control signal by the transfer gate signal line TRG00 is performed. Similarly, also the control signals of charge transfer sections 113 of other pixels 110 arranged in the pixel unit 100 (the control signals of the transfer gate signal lines TRG01 to TRG09) can be transmitted by first control signal transmission sections 102 and second control signal transmission sections 202. Thus, control signals are transmitted by a plurality of first control signal transmission sections 102 and a plurality of second control signal transmission sections 202. Note that the transmission of a signal by the first control signal transmission section 102 and the second control signal transmission section 202 may be performed also in each of other signal lines such as the resetting signal line RST0.

Further, the signal lines included in the signal line 12 are arranged between the pixel chip 10 and the circuit chip 20, and transmit image signals. If this situation is described using the signal line 12 placed at the left end of the drawing as an example, an image signal is transmitted via a first image signal transmission section 108 and a second image signal transmission section 204. The first image signal transmission section 108 is placed in the pixel chip 10, and transmits an image signal. Further, the second image signal transmission section 204 is placed in the circuit chip 20, and transmits an image signal. As the first image signal transmission section 108, a first image signal pad that is a pad formed on the joint surface of the pixel chip 10 may be used. Similarly, as the second image signal transmission section 204, a second image signal pad that is a pad formed on the joint surface of the circuit chip 20 may be used. Similarly to the pads used as the first control signal transmission section 102 and the second control signal transmission section 202 described above, these pads can be connected together by thermocompression bonding, and may contain copper.

The pixel 110 and the first image signal transmission section 108 are interconnected together by a first image signal line 107, and an image signal is transmitted between them. Further, the second image signal transmission section 204 and the analog/digital conversion unit 200 are interconnected together by a second image signal line 203, and an image signal is transmitted between them.

Note that the plurality of pixels 110 of the pixel chip 10 and the vertical scanning section 21 of the circuit chip 20 are included in an imaging element.

[Configuration of Pixel]

Figure 3:
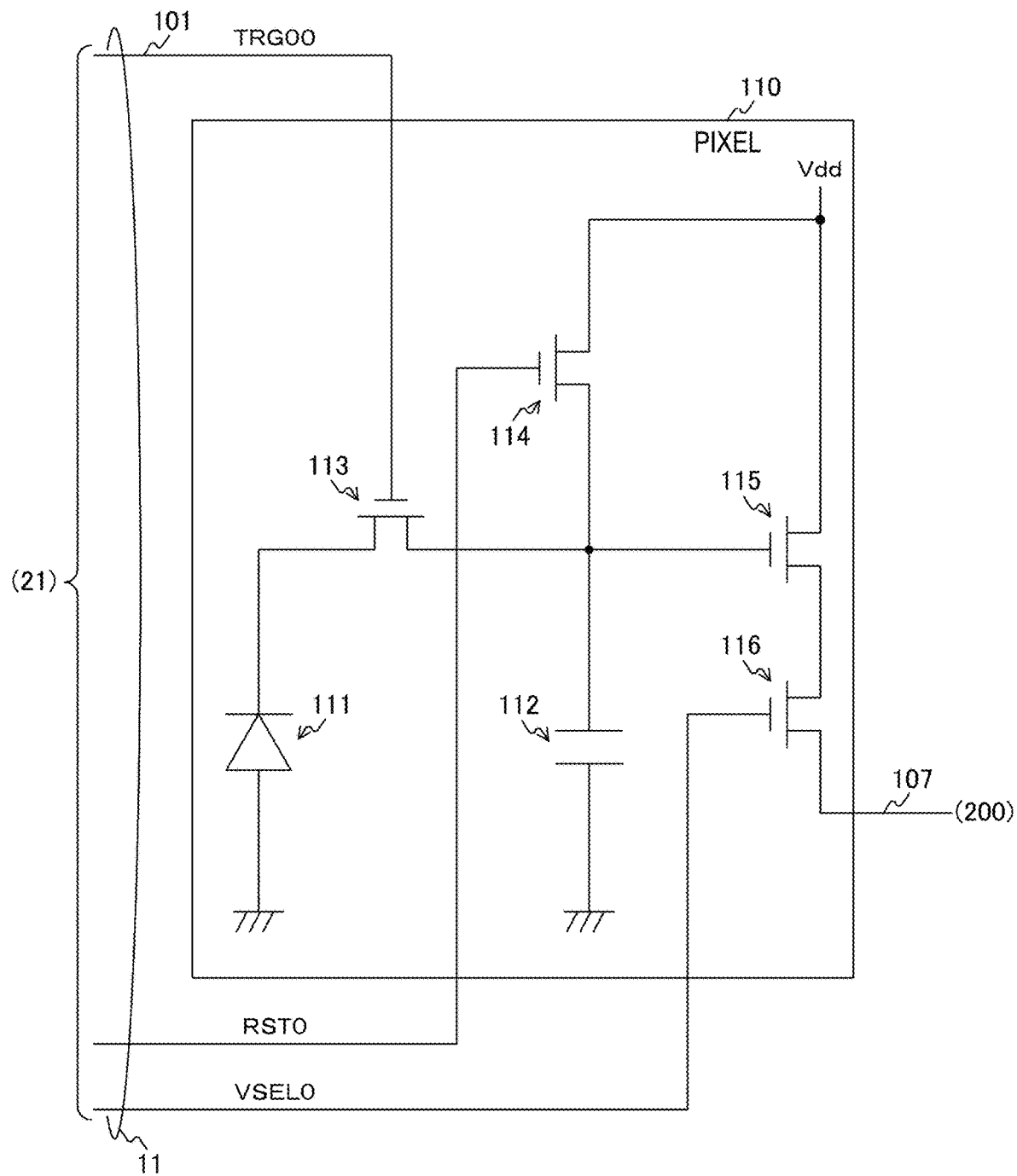
FIG. 3 is a diagram showing a configuration example of a pixel 110 in an embodiment of the present technology.

FIG. 3 is a diagram showing a configuration example of the pixel 110 in an embodiment of the present technology. The pixel 110 of the drawing corresponds to the pixel 110 placed in the 1st row and the 1st column in the pixel unit 100 described in FIG. 2. The pixel 110 includes a photoelectric conversion section 111, a charge transfer section 113, a charge retention section 112, a resetting section 114, a signal generation section 115, and a selection section 116. Note that an N-channel MOS transistor may be used for each of the charge transfer section 113, the resetting section 114, the signal generation section 115, and the selection section 116.

The anode of the photoelectric conversion section 111 is grounded, and the cathode is connected to the source of the charge transfer section 113. The gate of the charge transfer section 113 is connected to the transfer gate signal line TRG00 (the first control signal line 101), and the drain is connected to the drain of the resetting section 114, the gate of the signal generation section 115, and one end of the charge retention section 112. The other end of the charge retention section 112 is grounded. The gate of the resetting section 114 is connected to the resetting signal line RST0, and the source is connected to a power supply line Vdd. The drain of the signal generation section 115 is connected to the power supply line Vdd, and the source is connected to the drain of the selection section 116. The gate of the selection section 116 is connected to the selection signal line VSEL0, and the source is connected to the first image signal line 107.

The photoelectric conversion section 111 generates and retains a charge in accordance with applied light. A photodiode may be used for the photoelectric conversion section 111.

The charge transfer section 113 transfers a charge retained in the photoelectric conversion section 111 to the charge retention section 112. The charge transfer section 113 provides conduction between the photoelectric conversion section 111 and the charge retention section 112, and thereby transfers a charge. An ON signal is inputted to the charge transfer section 113 via the transfer gate signal line TRG00.

The charge retention section 112 retains the charge transferred by the charge transfer section 113. That is, the charge retention section 112 retains the charge generated by the photoelectric conversion section 111. A floating diffusion region formed in a diffusion layer of a semiconductor substrate may be used for the charge retention section 112. The charge retention section 112 is also a charge/voltage conversion means. That is, the charge retention section 112 is a stray capacitance; therefore, the voltage of, out of the two electrodes of the charge retention section 112, the electrode on the side connected to the signal generation section 115 is a voltage in accordance with the amount of charge retained in the charge retention section 112.

The resetting section 114 releases the charge retained in the charge retention section 112 to perform resetting. The resetting section 114 applies a power supply voltage to the charge retention section 112, and thereby releases the charge. An ON signal is inputted to the resetting section 114 via the resetting signal line RST0.

The signal generation section 115 generates a signal in accordance with the charge retained in the charge retention section 112, as an image signal. The signal generation section 115 amplifies the voltage of the charge retention section 112, which is a charge/voltage conversion means, and thereby generates an image signal.

The selection section 116 outputs the image signal generated by the signal generation section 115 to the first image signal line 107. An on signal is inputted to the selection section 116 via the selection signal line VSEL0.

[Configuration of Analog/Digital Conversion Unit]

Figure 4:
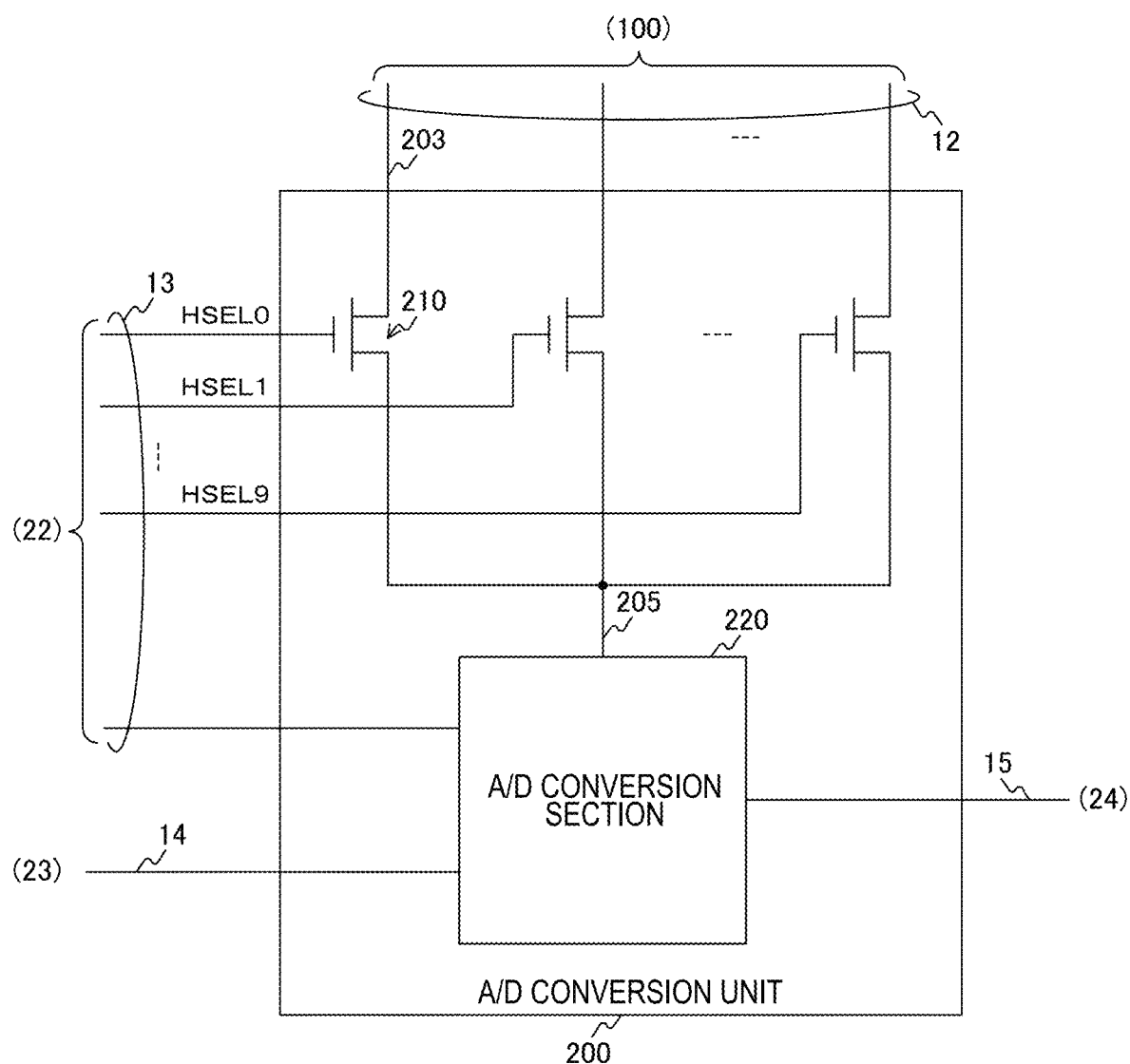
FIG. 4 is a diagram showing a configuration example of an analog/digital conversion unit 200 in an embodiment of the present technology.

FIG. 4 is a diagram showing a configuration example of the analog/digital conversion unit 200 in an embodiment of the present technology. The analog/digital conversion unit 200 includes MOS transistors 210 and an analog/digital conversion section 220.

The analog/digital conversion section 220 analog/digital converts an image signal inputted via a signal line 205, and generates a digital image signal. The generated digital image signal is outputted to the sense amplifier 24 via the signal line 15. Further, to the analog/digital conversion section 220, a control signal is inputted from the timing control section 22 via a signal line 13, and a reference signal is inputted from the reference signal generation section 23 via the signal line 14.

The MOS transistor 210 switches the image signal outputted from the pixel 110. The MOS transistor 210 is placed for each signal line 12. A description will now be given using the MOS transistor 210 placed at the left end of the drawing as an example. The drain of the MOS transistor 210 is connected to the signal line 12 (the second image signal line 203), and the source is connected to the signal line 205. The gate of the MOS transistor 210 is connected to a horizontal selection signal line HSEL (horizontal select) 0. The horizontal selection signal line HSEL0 is a signal line that transmits an ON signal of the MOS transistor 210. Signal lines of this type are drawn individually also to the gates of the other MOS transistors 210. In the drawing, these are distinguished by being marked with the column numbers described in FIG. 2. At the time when analog/digital conversion is performed in the analog/digital conversion section 220, an ON signal is inputted to one of the plurality of MOS transistors 210, and the MOS transistor 210 enters a conduction state; thus, an image signal outputted from a pixel 110 connected to the corresponding signal line 12 is selected. The ON signal is generated by the timing control section 22, and is transmitted by any of the horizontal selection signal lines HSEL0 to HSEL9.

[Configuration of Pixel Unit]

Figure 5:
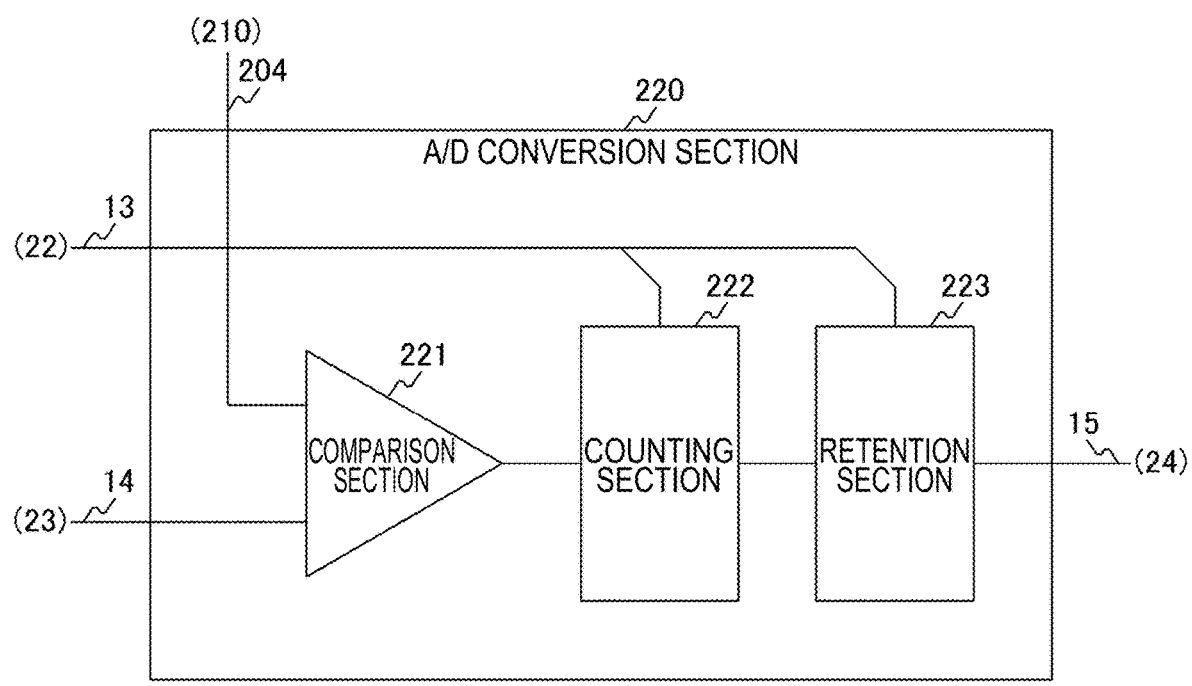
FIG. 5 is a diagram showing a configuration example of an analog/digital conversion section 220 in an embodiment of the present technology.

FIG. 5 is a diagram showing a configuration example of the analog/digital conversion section 220 in an embodiment of the present technology. The analog/digital conversion section 220 includes a comparison section 221, a counting section 222, and a retention section 223.

The comparison section 221 compares an image signal generated by the pixel 110 and a reference signal. The result of the comparison is outputted to the counting section 222. The operation of the comparison section 221 will now be described by envisaging a case where a signal in which voltage decreases in a ramp shape is used as the reference signal. The reference signal generation section 23 starts the output of a reference signal in conjunction with the start of analog/digital conversion of the analog/digital conversion section 220. In a case where the reference signal inputted to the comparison section 221 changes to a voltage lower than the image signal, the comparison section 221 detects this voltage, and outputs the voltage as a comparison result. That is, a comparison result is outputted when the reference signal and the image signal are substantially equal.

The counting section 222 measures the time from the start of analog/digital conversion in the analog/digital conversion section 220 to the output of a comparison result in the comparison section 221. The time measurement can be performed by counting clock signals. Specifically, the counting section 222 starts to count clock signals in conjunction with the start of analog/digital conversion, and stops the counting if a comparison result is inputted from the comparison section 221. As described above, the reference signal is a signal in which voltage decreases in a ramp form; therefore, the voltage of the reference signal and the count value of the counting section 222 correspond one to one. Hence, the count value of the counting section 222 corresponds to the result of analog/digital conversion of the image signal inputted to the analog/digital conversion section 220. The clock signal and the control signal of the counting section 222 are generated by the timing control section 22, and are inputted via the signal line 13.

The retention section 223 retains a digital image signal generated by the counting section 222. The retained digital image signal is outputted to the sense amplifier 24. The control signal is generated by the timing control section 22, and is inputted via the signal line 13.

Note that the analog/digital conversion section 220 may perform correlated double sampling (CDS). The CDS may be performed in the following manner, for example. After a prescribed light exposure period elapses, the resetting section 114 of the pixel 110 described in FIG. 3 is brought into conduction to perform resetting, an image signal at this time (an upon-resetting image signal) is inputted to the analog/digital conversion section 220, and counting is performed in the counting section 222. Next, the counting result is subjected to logic inversion in the counting section 222. Next, the charge transfer section 113 is brought into conduction in the pixel 110, and a charge generated by the photoelectric conversion section 111 is caused to be retained in the charge retention section 112. An image signal at this time is inputted to the analog/digital conversion section 220, and counting is performed again in the counting section 222. Thereby, counting is performed while the upon-resetting image signal is subtracted, and a noise component peculiar to each of the pixels 110 arranged in the pixel chip 10 can be removed.

[Vertical Scanning Section]

Figure 6:
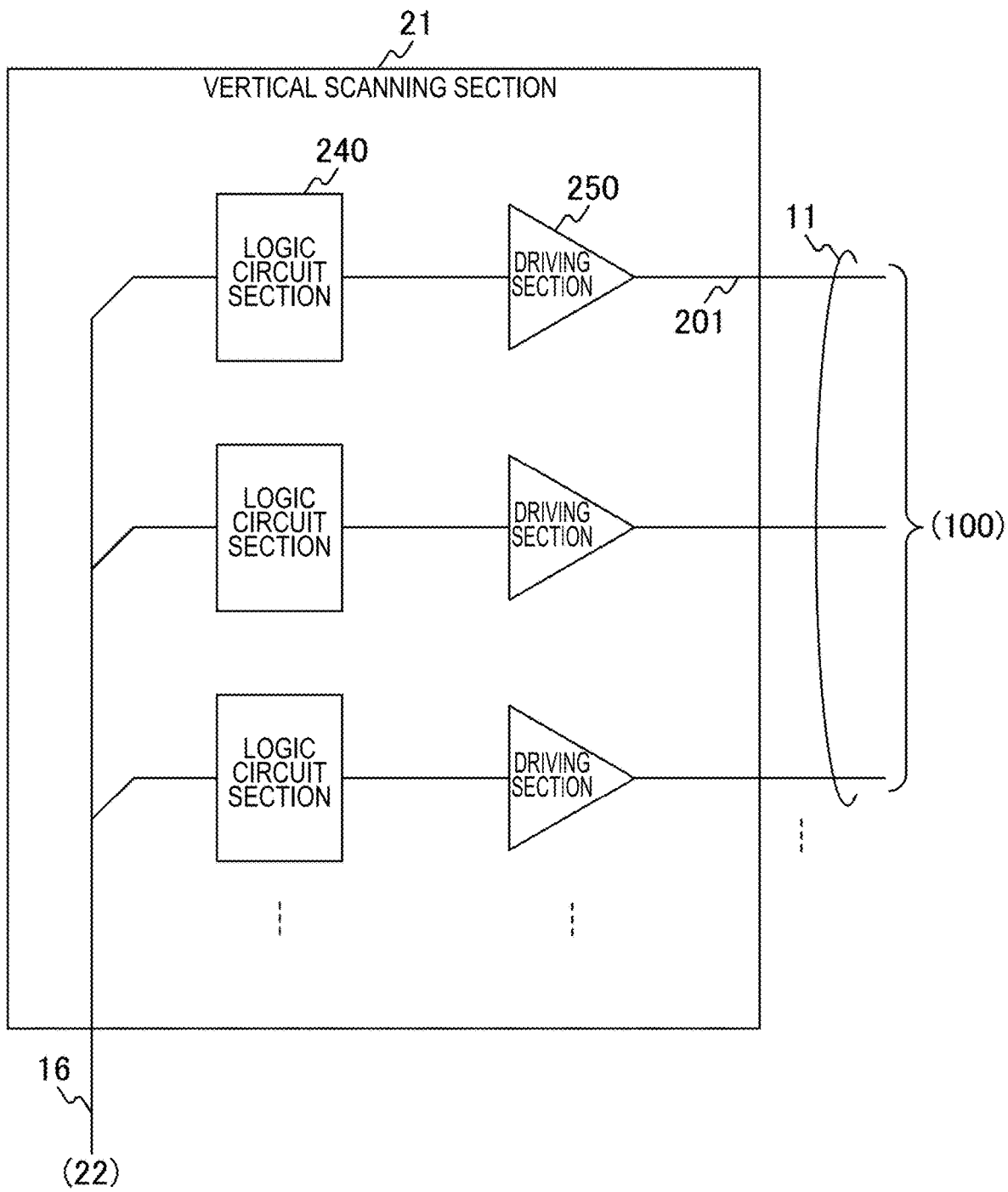
FIG. 6 is a diagram showing a configuration example of a vertical scanning section 21 in an embodiment of the present technology.

FIG. 6 is a diagram showing a configuration example of the vertical scanning section 21 in an embodiment of the present technology. The vertical scanning section 21 includes logic circuit sections 240 and driving sections 250.

The logic circuit section 240 generates control signals of pixels 110 arranged in the pixel unit 100 on the basis of control of the timing control section 22.

The driving section 250 generates an ON signal from a control signal generated by the logic circuit section 240, and outputs the ON signal as a control signal of the pixel 110.

Control signals of identical waveforms are inputted to signal lines of the same kind of the pixel units 100 arranged in the pixel chip 10 described in FIG. 1. If a description is given using the transfer gate signal line TRG00 described in FIG. 2 as an example, signals of identical waveforms are inputted to the transfer gate signal lines TRG00 drawn to all the pixel units 100. These signals are generated by the logic circuit section 240. Then, signals are outputted to rows of pixel units 100 arranged in the pixel chip 10 through different driving sections 250. By arranging driving sections 250 scatteredly in this way, a reduction or the like in operating speed of a MOS transistor of the pixel 110 due to insufficiency of driving capacity can be prevented.

[Configuration of Semiconductor Chips]

Figure 7:
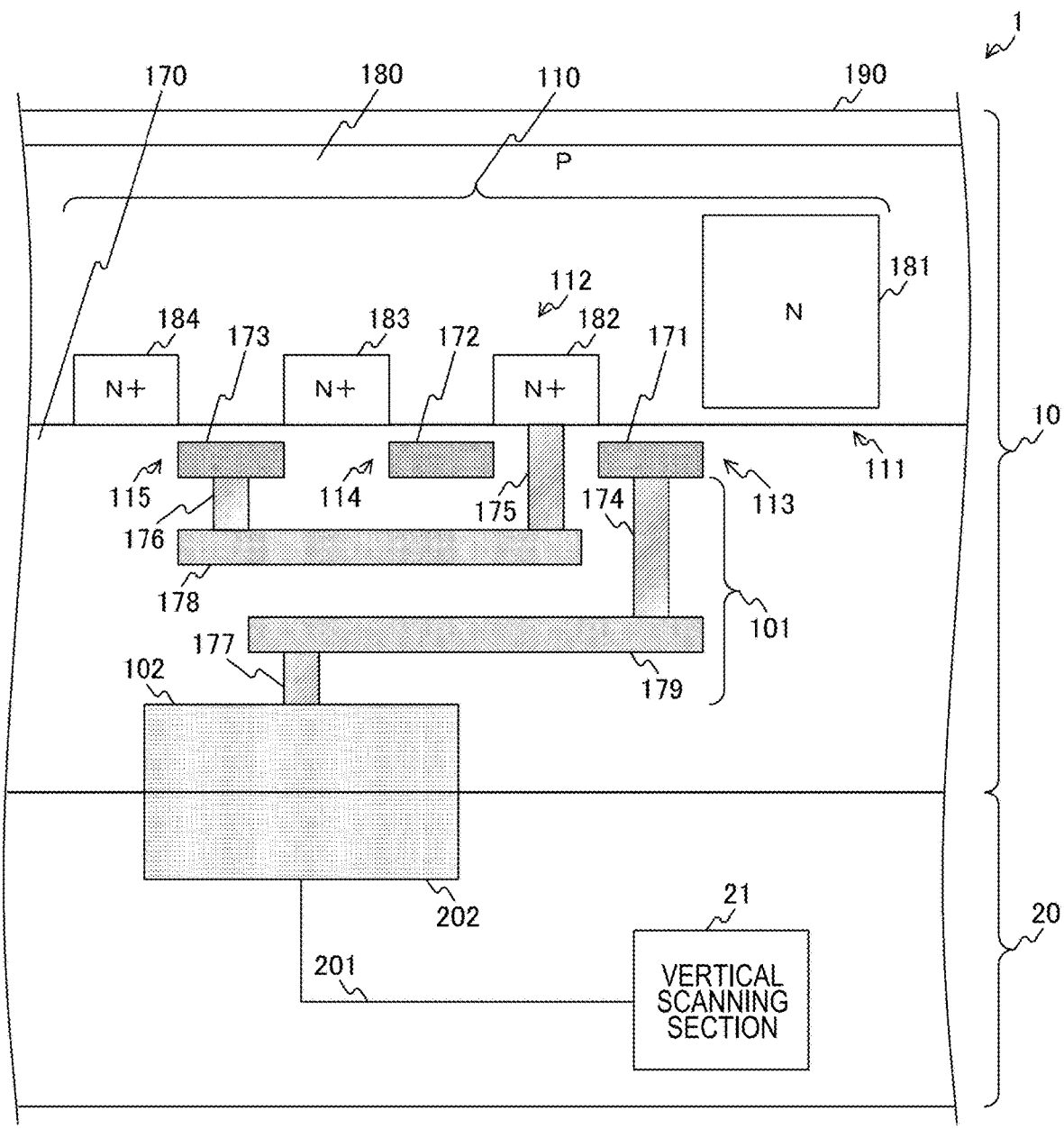
FIG. 7 is a diagram showing a configuration example of semiconductor chips in an embodiment of the present technology.

FIG. 7 is a diagram showing a configuration example of semiconductor chips in an embodiment of the present technology. The drawing is a schematic cross-sectional view showing a configuration example of the pixel chip 10 and the circuit chip 20 in the imaging device 1 that are joined together.

The pixel chip 10 of the drawing shows the configuration of the vicinity of the pixel 110. A p-type well region 180 is formed in a semiconductor substrate 190, and elements included in the pixel 110 are formed in the well region 180. The photoelectric conversion section 111 includes an n-type semiconductor region 181 and the surrounding well region 180. Photoelectric conversion is performed at the p-n junction formed at the interface between these. A charge generated by the photoelectric conversion is retained in the n-type semiconductor region 181. A gate 171, an n-type semiconductor region 182, a gate 172, an n-type semiconductor region 183, a gate 173, and an n-type semiconductor region 184 are formed in order adjacent to the photoelectric conversion section 111. Among these, the gates 171 to 173 are formed in an insulating layer 170 formed on a surface (the lower side in the drawing) of the well region 180. The gates 171 to 173 may contain polysilicon. Further, the insulating layer 170 may contain silicon dioxide or organic silica glass.

The charge transfer section 113 includes a MOS transistor that uses the n-type semiconductor regions 181 and 182 as the source and the drain, respectively, and the well region 180 in the vicinity of the gate 171 as a channel region. Further, the n-type semiconductor region 182 is included in a floating diffusion, and serves also as the charge retention section 112. The n-type semiconductor region 182 has an impurity concentration higher than the impurity concentration of the n-type semiconductor region 181. The resetting section 114 includes a MOS transistor that uses the n-type semiconductor regions 182 and 183 as the source and the drain, respectively, and the well region 180 in the vicinity of the gate 172 as the channel. The signal generation section 115 includes a MOS transistor that uses the n-type semiconductor regions 183 and 184 as the drain and the source, respectively, and the well region 180 in the vicinity of the gate 173 as the channel.

The n-type semiconductor region 182 included in the charge retention section 112 and the gate 173 of the signal generation section 115 are connected together by via plugs 175 and 176 and an interconnection 178. The via plugs 175 and 176 and the interconnection 178 may contain a metal such as copper. The n-type semiconductor region 183 is connected to the power supply line Vdd (not illustrated), and the n-type semiconductor region 184 is connected to the drain of the selection section 116 (not illustrated). Each of the n-type semiconductor regions 183 and 184 has an impurity concentration higher than the impurity concentration of the n-type semiconductor region 181.

The first control signal transmission section 102 is placed on a surface of the insulating layer 170 of the pixel chip 10 (the joint surface with the circuit chip 20). The first control signal transmission section 102 and the gate 171 of the charge transfer section 113 are connected together by via plugs 174 and 177 and an interconnection 179. Note that the via plugs 174 and 177 and the interconnection 179 are included in the first control signal line 101.

The circuit chip 20 of the drawing shows the configuration of the vicinity of the second control signal transmission section 202 in a simplified manner. The second control signal transmission section 202 is placed in a position of a surface of the circuit chip 20 facing the first control signal transmission section 102, and is electrically connected to the first control signal transmission section 102. The second control signal line 201 is placed between the second control signal transmission section 202 and the vertical scanning section 21, and a control signal is transmitted through the second control signal line 201.

[Arrangement of Control Signal Transmission Sections]

Figure 8:
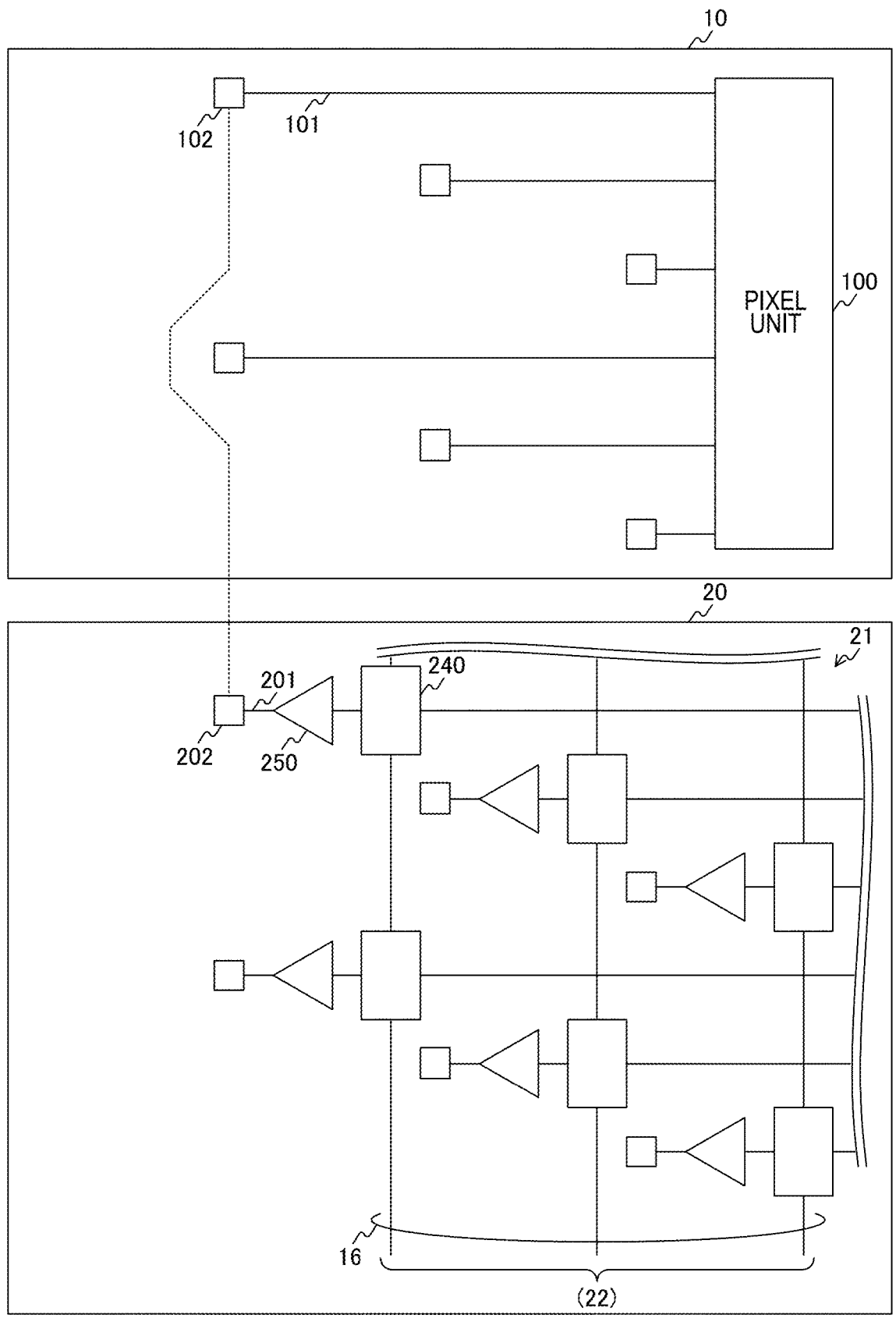
FIG. 8 is a diagram showing an arrangement example of control signal transmission sections in an embodiment of the present technology.

FIG. 8 is a diagram showing an arrangement example of control signal transmission sections in an embodiment of the present technology. The drawing shows a schematic top view of the pixel chip 10 and the circuit chip 20. The pixel chip 10 of the drawing shows an arrangement of a pixel unit 100, first control signal transmission sections 102, and first control signal lines 101. Further, the circuit chip 20 of the drawing shows an arrangement of logic circuit sections 240 and driving sections 250 included in the vertical scanning section 21, second control signal transmission sections 202, and second control signal lines 201. The broken line of the drawing shows a corresponding relationship between the first control signal transmission section 102 and the second control signal transmission section 202 when the pixel chip 10 and the circuit chip 20 are joined together.

The interconnection length of the first control signal line 101 can be shortened by thus placing the first control signal transmission section 102 in the vicinity of the pixel unit 100, for example, adjacent to the pixel 110. Pixels 110 etc. are usually arranged in a central portion of the pixel chip 10. Hence, also first control signal pads may be arranged in a central portion of the pixel chip 10. Here, the central portion of the pixel chip 10 refers to an area of the pixel chip 10 where pixels 110 are arranged, and refers to an area excluding a peripheral portion of the pixel chip 10. Further, the interconnection length of the second control signal line 201 can be shortened by placing the vertical scanning section 21 in the vicinity of the second control signal pad. Similarly, also first image signal pads may be arranged in a central portion of the pixel chip 10.

[Another Configuration of Semiconductor Chips]

Figure 9:
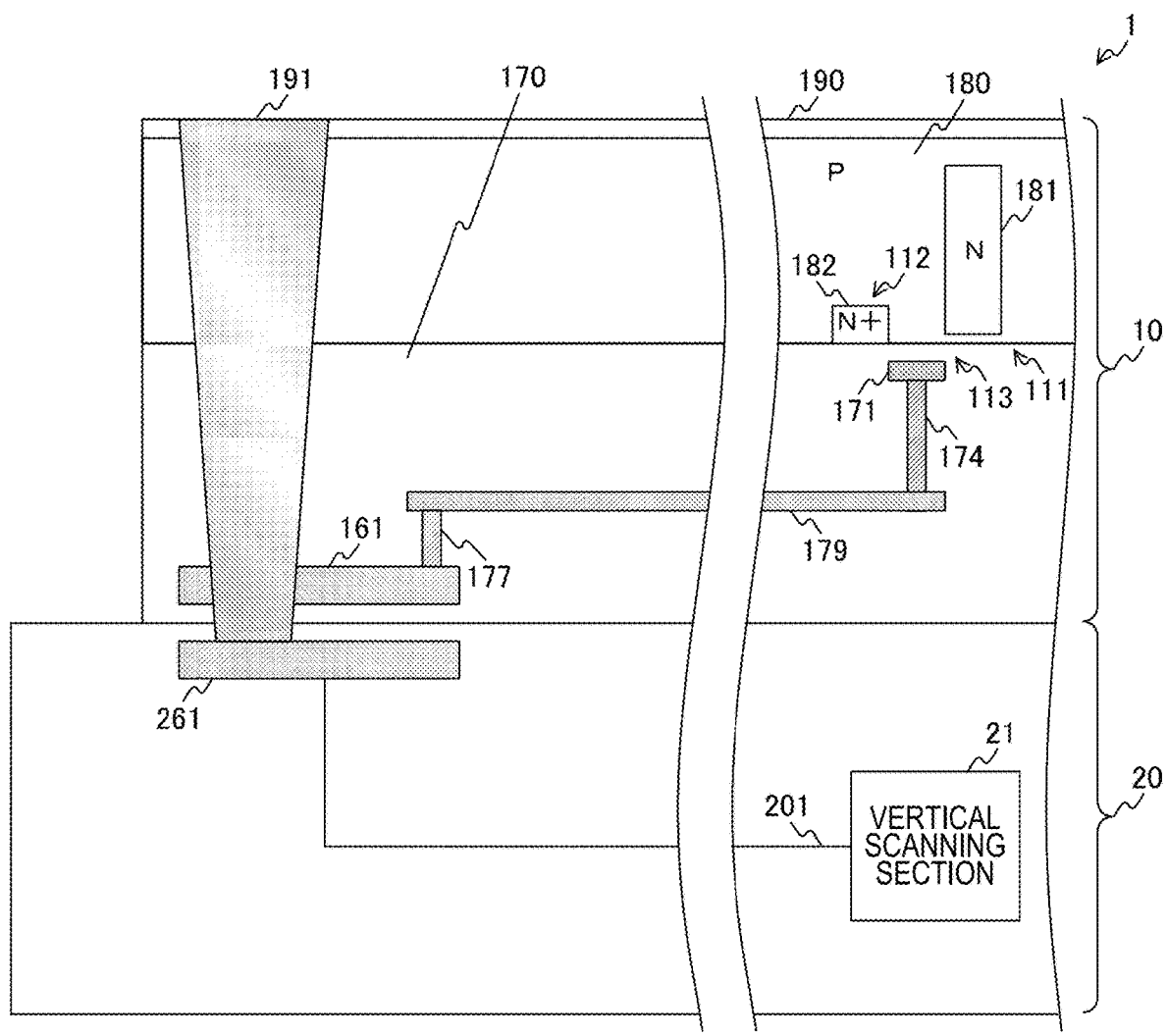
FIG. 9 is a diagram showing another configuration example of semiconductor chips in an embodiment of the present technology.

FIG. 9 is a diagram showing another configuration example of semiconductor chips in an embodiment of the present technology. The drawing shows, as a comparative example, a case where connection is made using a TSV instead of connection by the first control signal transmission section 102 and the second control signal transmission section 202 described in FIG. 7.

The imaging device 1 of the drawing differs from the imaging device 1 described in FIG. 7 in the following respects. First, an interconnection 161 is placed in place of the first control signal transmission section 102 in the pixel chip 10, and an interconnection 261 is placed in place of the second control signal transmission section 202 in the circuit chip 20. These interconnections are formed in the interior of the insulating layer 170 or the like. Further, a TSV 191 is formed in the pixel chip 10 and the circuit chip 20 of the drawing. The TSV 191 is placed in an end portion of the pixel chip 10. Otherwise, the configuration of the imaging device 1 is similar to the imaging device 1 described in FIG. 7, and therefore a description is omitted.

The TSV 191 can be formed in the following manner. First, the pixel chip 10 and the circuit chip 20 are joined together. Next, a via hole extending from the side of the pixel chip 10 to the interconnection 261 of the circuit chip 20 is formed. Next, a metal is placed in the via hole; thus, the TSV 191 is formed. In this event, the placed metal and the interconnections 161 and 261 are electrically connected together.

Thus, also in a case where the TSV 191 is used, a control signal can be transmitted between the pixel chip 10 and the circuit chip 20. However, it is necessary to form a via hole piercing the pixel chip 10, and therefore the TSV 191 requires a relatively large occupation area. Further, it is necessary to form the TSV 191 in an area apart from the MOS transistors etc. included in the pixel 110. Hence, the TSV 191 is formed in an end portion of the semiconductor chip (the pixel chip 10).

[Arrangement of TSVs]

Figure 10:
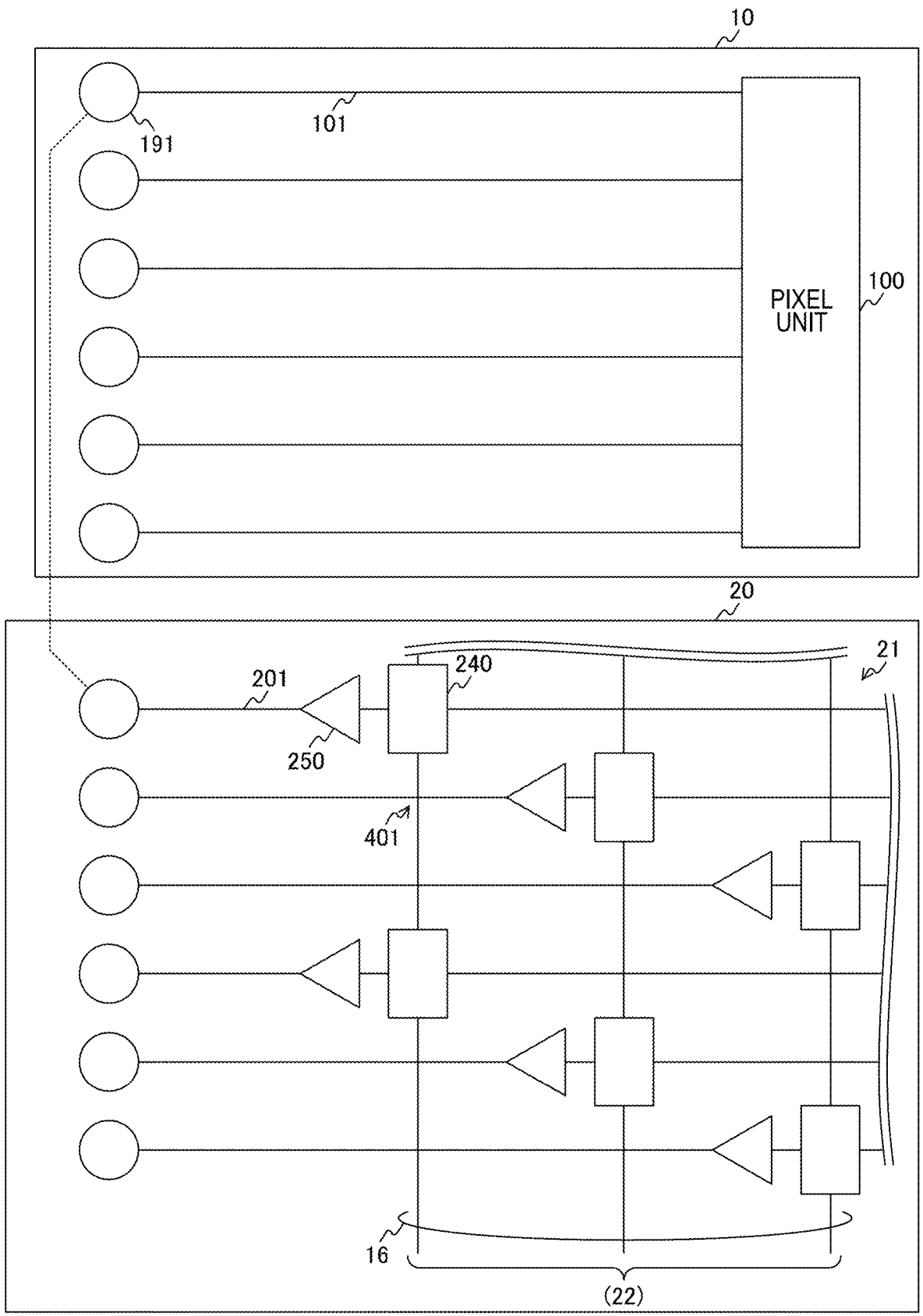
FIG. 10 is a diagram showing an arrangement example of TSVs in an embodiment of the present technology.

FIG. 10 is a diagram showing an arrangement example of TSVs in an embodiment of the present technology. The drawing shows a schematic top view of the pixel chip 10 and the circuit chip 20 described in FIG. 9. The pixel chip 10 and the circuit chip 20 of the drawing differ from the pixel chip 10 and the circuit chip 20 described in FIG. 8 in that the TSV 191 is provided in place of the first control signal transmission section 102 and the second control signal transmission section 202. As described in FIG. 9, the TSV 191 is formed in an end portion of the pixel chip 10. Hence, the first control signal line 101 and the second control signal line 201 are long. Hence, degradation of a control signal due to an increase in interconnection resistance occurs. Further, in the circuit chip 20, intersections 401 are produced with a signal line 16 due to increases in the interconnection lengths of the second control signal lines 201. Hence, it is necessary for the interconnection to have a multiple-layer structure, and the cost is increased.

Thus, in an embodiment of the present technology, in an imaging element in which a pixel chip including a plurality of pixels and a circuit chip that generates a control signal for each of the plurality of pixels are joined together, each control signal is transmitted by connection sections arranged in a joint portion. Thereby, the interconnection of control signals can be simplified.

<2. Operation of Embodiment>

Next, the operation of the imaging device 1 in an embodiment of the present technology is described.

[Image Signal Generation Processing]

Figure 11:
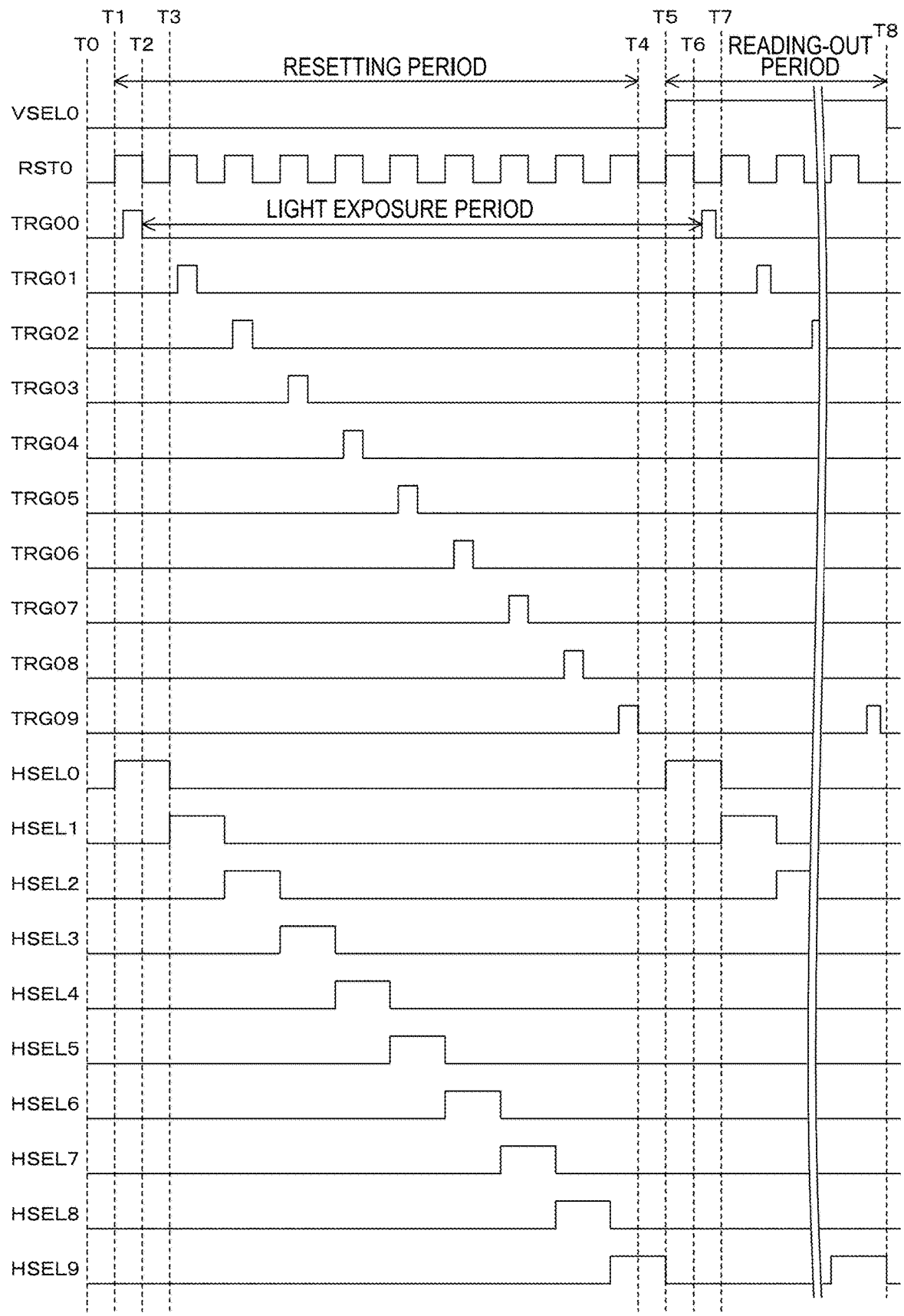
FIG. 11 is a diagram showing an example of image signal generation processing in an embodiment of the present technology.

FIG. 11 is a diagram showing an example of image signal generation processing in an embodiment of the present technology. The drawing shows image signal generation processing of the pixels 110 arranged in the 1st row in the pixel unit 100 described in FIG. 2.

In the drawing, VSEL0 and RST0 show signals of the vertical selection signal line VSEL0 and the resetting signal line RST0, respectively. TRG00 to TRG09 show signals of the transfer gate signal lines TRG00 to TRG09, respectively. HSEL0 to HSEL9 show signals of the horizontal selection signal lines HSEL0 to HSEL9, respectively. In each of these waveforms, the portion of the value "1" of a binarized signal indicates the input of an ON signal.

In T0 to T1, an ON signal is inputted to none of the signal lines, and the charge transfer sections 113 etc. of the pixels 110 arranged in the 1st row are in a non-conduction state. This period falls under the initial state.

In T1 to T3, an ON signal is inputted to the resetting signal line RST0, and the resetting sections 114 of the pixels 110 arranged in the 1st row enter a conduction state. After that, an ON signal is inputted to the transfer gate signal line TRG00, and the charge transfer section 113 of the pixel 110 placed in the 1st column among the pixels 110 arranged in the 1st row enters a conduction state; thus, charges retained in the photoelectric conversion section 111 and the charge retention section 112 of the pixel 110 are released, and resetting is performed (T1 to T2). After the resetting ends, the input of the ON signals to the resetting signal line RST0 and the transfer gate signal line TRG00 is stopped (T2). Thereby, the charge transfer section 113 enters a non-conduction state, and a light exposure period is started in this pixel. Further, an ON signal is inputted to the horizontal selection signal line HSEL0, and the MOS transistor 210 at the left end of FIG. 4 enters a conduction state (T1 to T3). However, an ON signal has not been inputted to the vertical selection signal line VSEL0, and hence an image signal is not outputted. As described later, in this period, an image signal is outputted from a pixel placed in the 10th row in the pixel unit 100. After that, the input of the ON signal to the horizontal selection signal line HSEL0 is stopped (T3).

In T3 to T5, ON signals are inputted to the resetting signal line RST0 like in T1 to T3. On the other hand, ON signals are sequentially inputted to the transfer gate signal lines TRG01 to TRG09. Thereby, resetting is sequentially performed in the pixels 110 except the pixel 110 placed in the 1st column among the pixels 110 arranged in the 1st row.

In T5 to T7, an ON signal is inputted to the vertical selection signal line VSEL0. Thereby, the selection sections 116 of the pixels 110 arranged in the 1st row enter a conduction state. Note that the input of the ON signal to the vertical selection signal line VSEL0 is continued up to T8. Further, an ON signal is inputted to the horizontal selection signal line HSEL0, and the MOS transistor 210 at the left end of FIG. 4 enters a conduction state (T5 to T7). Further, an ON signal is inputted to the resetting signal line RST0, and the resetting section 114 comes into conduction; thus, the charge retention section 112 is reset (T5 to T6). In this event, an upon-resetting image signal described in FIG. 5 is outputted from the pixel 110, and is analog/digital converted in the analog/digital conversion section 220.

After that, the input of the ON signal to the resetting signal line RST0 is stopped, and an ON signal is inputted to the transfer gate signal line TRG00 (T6 to T7). Thereby, in the pixel 110 placed in the 1st column among the pixels 110 arranged in the 1st row, the charge transfer section 113 enters a conduction state, and a charge retained in the photoelectric conversion section 111 is transferred to the charge retention section 112; thus, an image signal is generated by the signal generation section 115 and is outputted. The outputted image signal is analog/digital converted in the analog/digital conversion section 220, and CDS is executed. Note that the light exposure period in this pixel ends by the input of the ON signal to the transfer gate signal line TRG00. After that, the input of the ON signal from the transfer gate signal line TRG00 is stopped. Further, also the input of the ON signal to the horizontal selection signal line HSEL0 is stopped (T7).

In T7 to T8, the input of ON signals to the resetting signal line RST0 similar to that in T5 to T7 is consecutively performed. Further, ON signals are sequentially inputted to the transfer gate signal lines TRG01 to TRG09 and the horizontal selection signal lines HSEL1 to HSEL9. Thereby, the output of image signals and analog/digital conversion are sequentially performed in the pixels 110 except the pixel 110 placed in the 1st column among the pixels 110 arranged in the 1st row.

Thereby, in the pixels 110 arranged in the 1st row, transfers of charges in the charge transfer sections 113 are sequentially performed on a pixel 110 basis, and the processing of generating image signals is sequentially executed. Such a system in which resetting and the generation of an image signal are sequentially performed for each of a plurality of pixels 110 is referred to as a rolling shutter. In the drawing, the period of T1 to T4 corresponds to a resetting period in which the resetting of each pixel is performed. On the other hand, the period of T5 to T8 corresponds to a reading-out period in which an image signal is caused to be outputted from each pixel.

Figure 12:
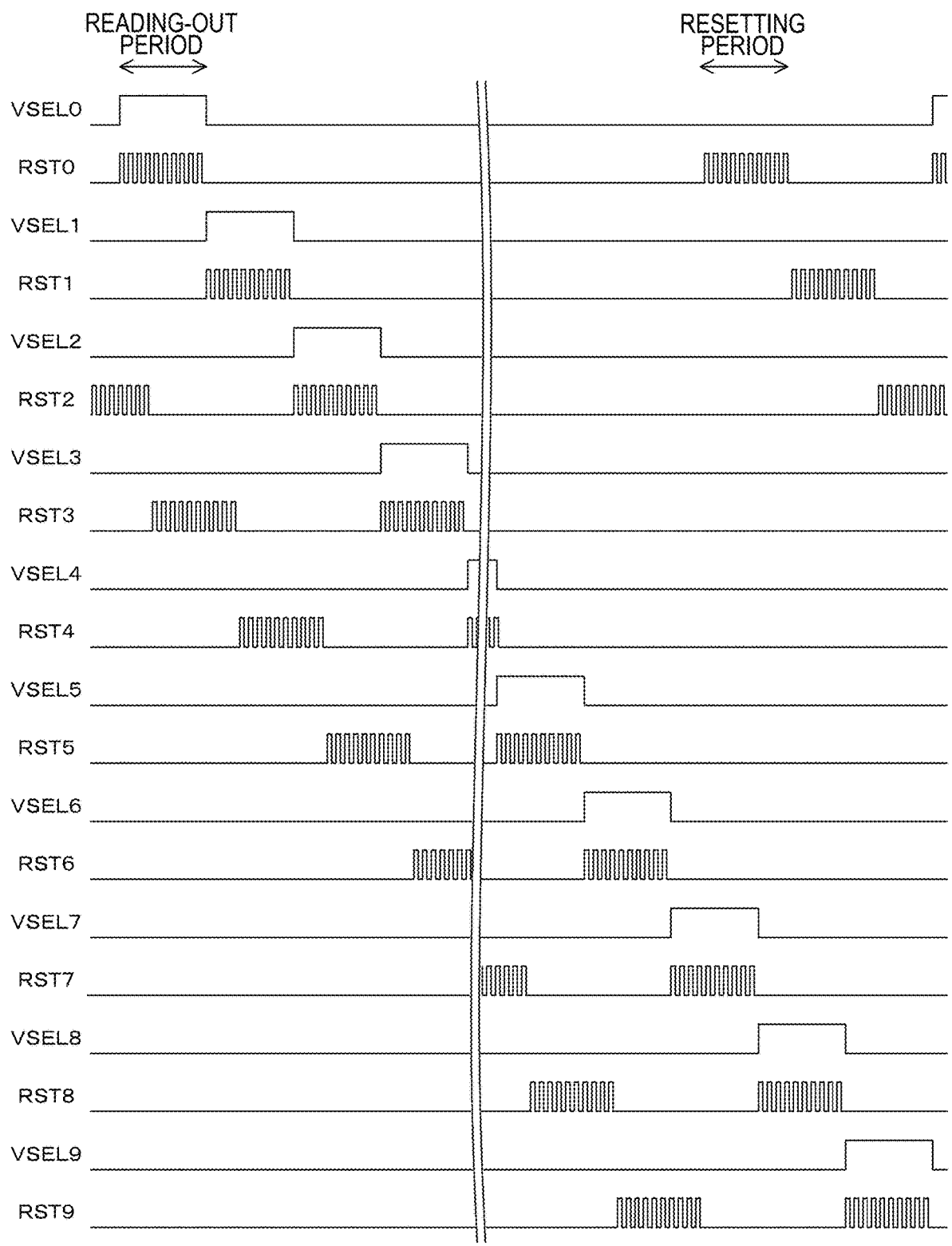
FIG. 12 is a diagram showing an example of image signal generation processing in an embodiment of the present technology.

FIG. 12 is a diagram showing an example of image signal generation processing in an embodiment of the present technology. The drawing shows image signal processing of all the pixels 110 arranged in the pixel unit 100. In the drawing, VSEL0 to VSEL9 show signals of the vertical selection signal lines VSEL0 to VSEL9, respectively. Further, RST0 to RST9 show signals of the resetting signal lines RST0 to RST9, respectively. A description of the other signals is omitted.

As shown in the drawing, a resetting period and a reading-out period are sequentially set for each row of pixels 110 in the pixel unit 100, and an image signal is generated. Image signal generation in the pixel chip 10 can be performed by performing this processing on all the pixel units 100 arranged in the pixel chip 10. Further, distortion peculiar to the rolling shutter system can be made inconspicuous by performing imaging of the rolling shutter system on a pixel unit 100 basis.

Thus, according to an embodiment of the present technology, in an imaging element in which a pixel chip including a plurality of pixels and a circuit chip that generates a control signal for each of the plurality of pixels are joined together, imaging of the rolling shutter system can be performed, and image quality can be improved.

The above-described embodiments are examples for embodying the present technology, and matters in the embodiments each have a corresponding relationship with disclosure-specific matters in the claims. Likewise, the matters in the embodiments and the disclosure-specific matters in the claims denoted by the same names have a corresponding relationship with each other. However, the present technology is not limited to the embodiments, and various modifications of the embodiments may be embodied in the scope of the present technology without departing from the spirit of the present technology.

The processing sequences that are described in the embodiments described above may be handled as a method having a series of sequences or may be handled as a program for causing a computer to execute the series of sequences and recording medium storing the program. As the recording medium, a CD (Compact Disc), an MD (MiniDisc), and a DVD (Digital Versatile Disc), a memory card, and a Blu-ray disc (registered trademark) can be used.

Note that the effects described in the present specification are not necessarily limited, and any effect described in the present disclosure may be exhibited.

Additionally, the present technology may also be configured as below.

(1)
An imaging element including:
a pixel chip including
a plurality of pixels each including
a charge transfer section configured to transfer a charge generated in accordance with incident light to a charge retention section in accordance with a control signal, and
a plurality of first control signal transmission sections each configured to transmit the control signal for each of the charge transfer sections; and
a circuit chip including
a control signal generation section configured to generate the control signal for each of the charge transfer sections of the plurality of pixels, and
a plurality of second control signal transmission sections provided to individually correspond to the first control signal transmission sections and each configured to transmit the generated control signal.

(2)
The imaging element according to (1),
in which the plurality of first control signal transmission sections include a plurality of first control signal pads, and
the plurality of second control signal transmission sections include a plurality of second control signal pads.

(3)
The imaging element according to (2),
in which the plurality of first control signal pads are arranged in a central portion of the pixel chip.

(4)
The imaging element according to (2) or (3),
in which the plurality of first control signal pads and the plurality of second control signal pads are connected together by thermocompression bonding.

(5)
The imaging element according to any one of (2) to (4),
in which the plurality of first control signal pads and the plurality of second control signal pads contain copper.

(6)
The imaging element according to any one of (1) to (5),
in which the pixel chip further includes
a first image signal transmission section configured to transmit an image signal generated in accordance with a charge transferred to the charge retention section, and
the circuit chip further includes
an analog/digital conversion section configured to analog/digital convert the generated image signal, and
a second image signal transmission section provided to correspond to the first image signal transmission section and configured to transmit the generated image signal to the analog/digital conversion section.

(7)
The imaging element according to (6),
in which the first image signal transmission section includes a first image signal pad, and
the second image signal transmission section includes a second image signal pad.

(8)
The imaging element according to (7),
in which the first image signal pad is placed in a central portion of the pixel chip.

(9)
The imaging element according to any one of (6) to (8),
in which the analog/digital conversion sections are arranged scatteredly for pixel units each including a plurality of pixels.

(10)
The imaging element that generates the control signal, according to any one of (1) to (8),
in which the control signal generation section generates, as the control signals, signals that sequentially cause the charge transfer sections of the plurality of pixels to transfer the generated charges, and
the pixel chip sequentially transfers the generated charges to the charge retention sections for the plurality of pixels.

(11)
An imaging device including:
a pixel chip including
a plurality of pixels each including
a charge transfer section configured to transfer a charge generated in accordance with incident light to a charge retention section in accordance with a control signal,
a plurality of first control signal transmission sections each configured to transmit the control signal for each of the charge transfer sections, and
a first image signal transmission section configured to transmit an image signal generated in accordance with a charge transferred to the charge retention section; and
a circuit chip including
a control signal generation section configured to generate the control signal for each of the charge transfer sections of the plurality of pixels,
a plurality of second control signal transmission sections provided to individually correspond to the first control signal transmission sections and each configured to transmit the generated control signal,
an analog/digital conversion section configured to analog/digital convert the generated image signal,
a second image signal transmission section provided to correspond to the first image signal transmission section and configured to transmit the generated image signal to the analog/digital conversion section, and
a processing circuit configured to process the analog/digital converted image signal.

REFERENCE SIGNS LIST 1 imaging device
10 pixel chip
20 circuit chip
21 vertical scanning section
22 timing control section
23 reference signal generation section
24 sense amplifier
25 signal processing section
100 pixel unit
101 first control signal line 102 first control signal transmission section
107 first image signal line
108 first image signal transmission section
110 pixel
111 photoelectric conversion section
112 charge retention section
113 charge transfer section
114 resetting section
115 signal generation section
116 selection section
161, 178, 179, 261 interconnection
174 to 177 via plug
191 TSV
200 analog/digital conversion unit
201 second control signal line
202 second control signal transmission section
203 second image signal line
204 second image signal transmission section
220 analog/digital conversion section
221 comparison section
222 counting section
223 retention section
240 logic circuit section
250 driving section

The invention claimed is:

1. An imaging element, comprising:
a pixel chip including:
a plurality of pixels each including:
charge transfer circuitry configured to transfer a charge generated in accordance with incident light to a charge retention circuit in accordance with a control signal,
a plurality of first control signal transmission circuitries each configured to transmit the control signal for each of the charge transfer circuitries, and
a plurality of first image signal transmission circuitries each configured to transmit an image signal generated in accordance with a charge transferred to the charge retention circuit,
wherein the plurality of first image transmission circuitries includes a plurality of first image signal pads,
wherein each of the plurality of first image signal pads is connected to a column of pixels of a pixel unit for the plurality of pixels, and
wherein the plurality of first image signal pads are placed in a central portion, excluding peripheral portions, of the pixel chip; and
a circuit chip including:
a control signal generation circuit configured to generate the control signal for each of the charge transfer circuitries of the plurality of pixels,
a plurality of second control signal transmission circuitries provided to individually correspond to the first control signal transmission circuitries and each configured to transmit the generated control signal,
an analog/digital conversion section configured to analog/digital convert the generated image signal, and
a plurality of second image signal transmission circuitries each provided to correspond to each of the plurality of first image signal transmission circuitries and configured to transmit the generated image signal to the analog/digital conversion section,
wherein the plurality of second image transmission circuitries includes a plurality of second image signal pads, and
wherein the plurality of first image signal pads is connected to the plurality of second image signal pads.

2. The imaging element according to claim 1,
wherein the plurality of first control signal transmission circuitries include a plurality of first control signal pads, and
the plurality of second control signal transmission circuitries include a plurality of second control signal pads.

3. The imaging element according to claim 2, wherein the plurality of first control signal pads are arranged in the central portion, excluding peripheral portions, of the pixel chip.

4. The imaging element according to claim 2,
wherein the plurality of first control signal pads and the plurality of second control signal pads are connected together by thermocompression bonding.

5. The imaging element according to claim 2,
wherein the plurality of first control signal transmission circuitries and the plurality of second control signal transmission circuitries contain copper.

6. The imaging element according to claim 1,
wherein the analog/digital conversion sections are arranged scatteredly for the pixel units each including a plurality of pixels.

7. The imaging element according to claim 1,
wherein the control signal generation circuit generates, as the control signals, signals that sequentially cause the charge transfer circuitries of the plurality of pixels to transfer the generated charges, and
the pixel chip sequentially transfers the generated charges to the charge retention circuits for the plurality of pixels.

8. The imaging element according to claim 1, wherein the plurality of second image signal pads are placed in the central portion, excluding peripheral portions, of the circuit chip.

9. The imaging element according to claim 2, wherein the plurality of second control signal pads are placed in the central portion, excluding peripheral portions, of the circuit chip.

10. An imaging device, comprising:
a pixel chip including:
a plurality of pixels each including:
charge transfer circuitry configured to transfer a charge generated in accordance with incident light to a charge retention circuit in accordance with a control signal,
a plurality of first control signal transmission circuitries each configured to transmit the control signal for each of the charge transfers circuitries, and
a plurality of first image signal transmission circuitries each configured to transmit an image signal generated in accordance with a charge transferred to the charge retention circuit,
wherein the plurality of first image transmission circuitries includes a plurality of first image signal pads,
wherein each of the plurality of first image signal pads is connected to a column of pixels of a pixel unit for the plurality of pixels, and
wherein the plurality of first image signal pads are places in a central portion, excluding peripheral portions, of the pixel chip; and a circuit chip including:
- a control signal generation circuit configured to generate the control signal for each of the charge transfer circuitries of the plurality of pixels,
- a plurality of second control signal transmission circuitries provided to individually correspond to the first control signal transmission circuitries and each configured to transmit the generated control signal,
- an analog/digital conversion section configured to analog/digital convert the generated image signal, and
- a plurality of second image signal transmission circuitries each provided to correspond to each of the plurality of first image signal transmission circuitries and configured to transmit the generated image signal to the analog/digital conversion section,
- wherein the plurality of second image transmission circuitries includes a plurality of second image signal pads, and
- wherein the plurality of first image signal pads is connected to the plurality of second image signal pads, and
- a processing circuit configured to process the analog/digital converted image signal.

11. The imaging device according to claim 10,
wherein the plurality of first control signal transmission circuitries include a plurality of first control signal pads, and
the plurality of second control signal transmission circuitries include a plurality of second control signal pads.

12. The imaging device according to claim 11, wherein the plurality of first control signal pads are arranged in the central portion, excluding peripheral portions, of the pixel chip.

13. The imaging device according to claim 11,
wherein the plurality of first control signal pads and the plurality of second control signal pads are connected together by thermocompression bonding.

14. The imaging device according to claim 11,
wherein the plurality of first control signal transmission circuitries and the plurality of second control signal transmission circuitries contain copper.

15. The imaging device according to claim 10,
wherein the analog/digital conversion sections are arranged scatteredly for the pixel units each including a plurality of pixels.

16. The imaging device according to claim 10,
wherein the control signal generation circuit generates, as the control signals, signals that sequentially cause the charge transfer circuitries of the plurality of pixels to transfer the generated charges, and
the pixel chip sequentially transfers the generated charges to the charge retention circuitries for the plurality of pixels.

17. The imaging device according to claim 10, wherein the plurality of second image pads are placed in the central portion, excluding peripheral portions, of the circuit chip.

18. The imaging device according to claim 11, wherein the plurality of second control pads are placed in the central portion, excluding peripheral portions, of the circuit chip.

* * * * *